US009432027B1

(12) United States Patent
Lin

(10) Patent No.: US 9,432,027 B1
(45) Date of Patent: Aug. 30, 2016

(54) POWER GENERATING CIRCUIT, FREQUENCY GENERATING CIRCUIT AND FREQUENCY CONTROL SYSTEM

(71) Applicant: EGALAX_EMPIA TECHNOLOGY INC., Taipei (TW)

(72) Inventor: Po-Chuan Lin, Taipei (TW)

(73) Assignee: EGALAX_EMPIA TECHNOLOGY INC., Taipei (TW)

( * ) Notice: Subject to any disclaimer, the term of this patent is extended or adjusted under 35 U.S.C. 154(b) by 0 days.

(21) Appl. No.: 14/822,042

(22) Filed: Aug. 10, 2015

(30) Foreign Application Priority Data

Mar. 19, 2015 (TW) ............................ 104108852 A

(51) Int. Cl.

*H03L 7/06* (2006.01)
*H03L 7/08* (2006.01)
*H03L 7/089* (2006.01)
*H03L 7/099* (2006.01)
*H03M 1/66* (2006.01)

(52) U.S. Cl.

CPC ........... *H03L 7/0802* (2013.01); *H03L 7/0896* (2013.01); *H03L 7/099* (2013.01); *H03M 1/66* (2013.01)

(58) Field of Classification Search

USPC ................................ 327/147–149, 156–159
See application file for complete search history.

(56) References Cited

U.S. PATENT DOCUMENTS 8,963,750 B2 * 2/2015 Canard ................ G04F 10/005 327/107
2008/0253492 A1 * 10/2008 Wang .................. H03K 3/0315 375/376
2009/0085679 A1 * 4/2009 Jennings ................ H03L 7/093 331/1 A
2010/0202794 A1 * 8/2010 Kosaka ................ G03G 15/043 399/88
2012/0105110 A1 * 5/2012 Kitayama ............ H03G 1/0058 327/105
2012/0194265 A1 * 8/2012 Katsube ............. H03H 11/1252 327/554
2013/0222067 A1 * 8/2013 Yin ........................ H03L 7/099 331/25
2016/0043715 A1 * 2/2016 Kurokawa ........... H03K 17/687 365/189.011

* cited by examiner

*Primary Examiner* — Adam Houston
(74) *Attorney, Agent, or Firm* — Huffman Law Group, PC

(57) ABSTRACT

A frequency control system includes a power generating circuit and a frequency generating circuit. The power generating circuit includes an up transistor circuit, a down transistor circuit and a capacitor for generating a stable voltage. The frequency generating circuit includes a digital-to-analog converter (DAC), a current source/sink circuit, a voltage-controlled oscillator (VCO) and a digital controller. The DAC receives the stable voltage as a power, the current source/sink circuit receives an analog signal from the DAC, the VCO receives a control voltage from the current source/sink circuit, and the digital controller receives a frequency signal from the VCO and a reference signal, according to which a digital signal is generated and fed to the DAC.

26 Claims, 3 Drawing Sheets

POWER GENERATING CIRCUIT, FREQUENCY GENERATING CIRCUIT AND FREQUENCY CONTROL SYSTEM

CROSS-REFERENCE TO RELATED APPLICATIONS

The entire contents of Taiwan Patent Application No. 104108852, filed on Mar. 19, 2015, from which this application claims priority, are incorporated herein by reference.

BACKGROUND OF THE INVENTION

1. Field of the Invention

The present invention generally relates to a frequency control system, and more particularly to a small-area, low-power and anti-power-noise frequency control system.

2. Description of Related Art

A phase-locked loop (PLL) is commonly used in electronic devices such as communication devices or computers to detect frequency or phase, or to perform frequency multiplication. A delay-locked loop (DLL), being similar to the PLL, utilizes a delay line instead of a voltage-controlled oscillator, and may be adopted to reduce clock skew in digital circuits.

A large capacitor is required to implement a filtering circuit in the conventional PLL, and thus occupies large circuit area. Moreover, the conventional PLL or DLL consumes large current and thus cannot be adapted to mobile or hand-held electronic devices. Further, the conventional PLL or DLL is liable to power noise, and therefore suffers low output accuracy.

A need has thus arisen to propose a novel frequency control system to overcome disadvantages of conventional systems, and may be adapted to mobile or hand-held electronic devices having limited resources or being liable to noise.

SUMMARY OF THE INVENTION

In view of the foregoing, it is an object of the embodiment of the present invention to provide a frequency control system to reduce the effect of power noise, to decrease circuit area and/or to cut down power consumption.

According to one embodiment, a frequency control system includes a power generating circuit and a frequency generating circuit. The power generating circuit includes an up transistor circuit, a down transistor circuit and a capacitor, the up transistor circuit and the down transistor circuit being connected in series and having a node situated therebetween, the capacitor being electrically coupled between the node and ground, a stable voltage being generated at the node. The frequency generating circuit includes a digital-to-analog converter (DAC), a current source/sink circuit, a voltage-controlled oscillator (VCO) and a digital controller. The DAC receives the stable voltage as a power, and outputs an analog signal; the current source/sink circuit receives the analog signal and outputs a control voltage; the VCO receives the control voltage and according generates a frequency signal; and the digital controller receives the frequency signal and a reference signal, according to which a digital signal is generated and fed to an input end of the DAC.

DETAILED DESCRIPTION OF THE INVENTION

Figure 1:
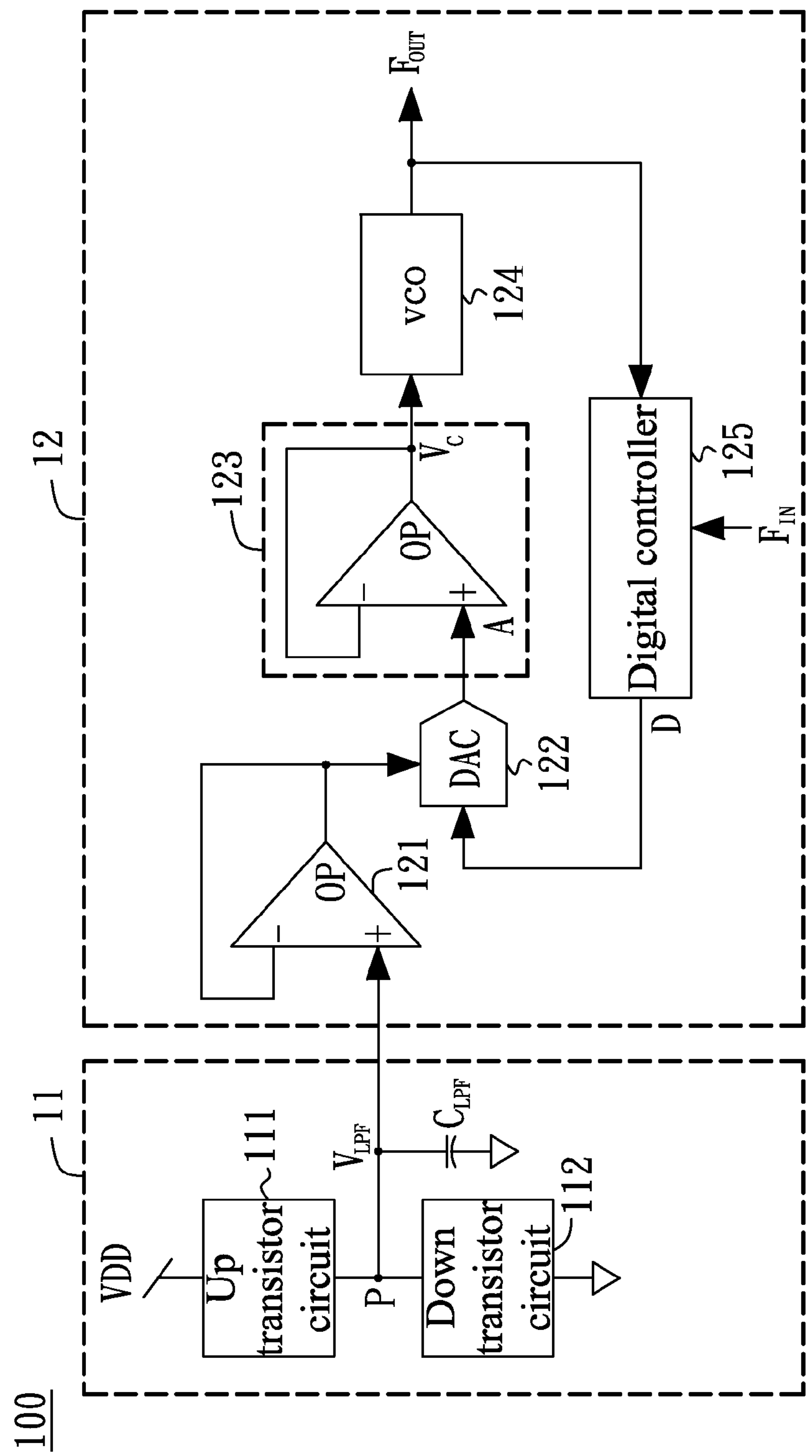
FIG. 1 shows a block diagram illustrating a frequency control system according to one embodiment of the present invention.

FIG. 1 shows a block diagram illustrating a frequency control system 100 according to one embodiment of the present invention. In the embodiment, the frequency control system 100 includes a power generating circuit 11 and a frequency generating circuit 12. Specifically, the power generating circuit 11 generates a stable voltage $V_{LPF}$, which is provided as a power to a portion of the frequency generating circuit 12. The frequency generating circuit 12, also called frequency multiplication circuit, is used to generate a frequency signal $F_{OUT}$.

The power generating circuit 11 of the embodiment may include an up transistor circuit 111 and a down transistor circuit 112, which are connected in series and electrically coupled between an original power VDD and ground. A node P is situated between the up transistor circuit 111 and the down transistor circuit 112. The up transistor circuit 111 and the down transistor circuit 112 constitute a voltage divider, which provides the table voltage $V_{LPF}$ at the node P. The up transistor circuit 111 may include at least one transistor such as a P-type metal-oxide-semiconductor (MOS) transistor, and the down transistor circuit 112 may include at least one transistor such as an N-type MOS transistor. The power generating circuit 11 may further include a capacitor $C_{LPF}$, which is electrically coupled between the node P and ground.

Figure 2A:
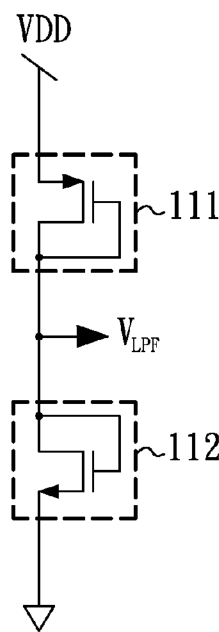
FIG. 2A to FIG. 2C show circuit diagrams exemplifying the up transistor circuit and the down transistor circuit of FIG. 1.
Figure 2B:
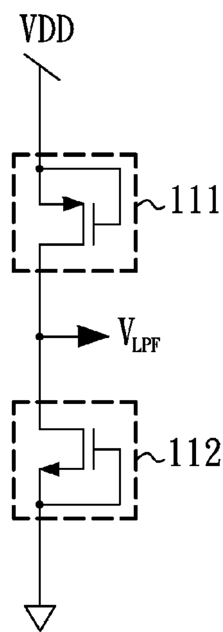
Figure 2C:
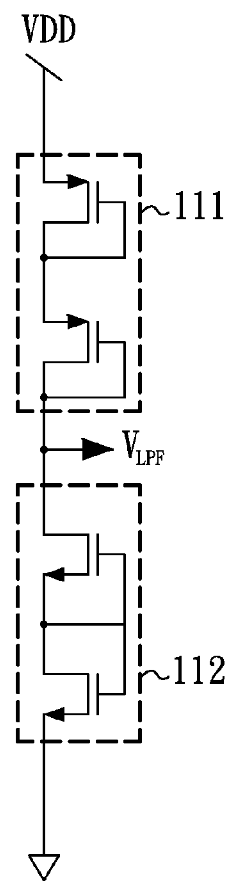

In the embodiment, the transistors of the up transistor circuit 111 and the down transistor circuit 112 may be diode-connected, or may operate in a cut-off or sub-threshold region. In the specification, diode-connected means connecting a drain and a gate of the transistor. Operating in a cut-off region or sub-threshold region means connecting a source and a gate of the transistor. FIG. 2A shows a circuit diagram exemplifying the up transistor circuit 111 and the down transistor circuit 112 of FIG. 1. In this example, the up transistor circuit 111 and the down transistor circuit 112 each includes a diode-connected transistor. FIG. 2B shows another circuit diagram exemplifying the up transistor circuit 111 and the down transistor circuit 112 of FIG. 1. In this example, the up transistor circuit 111 and the down transistor circuit 112 each includes a transistor that operates in a cut-off region. FIG. 2C shows a further circuit diagram exemplifying the up transistor circuit 111 and the down transistor circuit 112 of FIG. 1. In this example, the up transistor circuit 111 includes two diode-connected transistors that are connected in series, and the down transistor circuit 112 includes a transistor operating in a cut-off region and a diode-connected transistor, which are connected in series.

Figure 3:
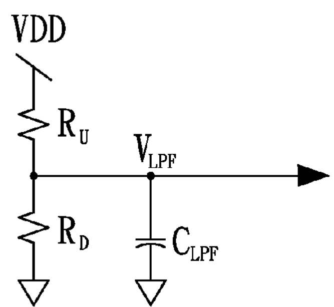
FIG. 3 shows an equivalent circuit diagram of the power generating circuit of FIG. 1.

FIG. 3 shows an equivalent circuit diagram of the power generating circuit 11. The diode-connected transistor or the transistor operating in a cut-off region or sub-threshold region of the up transistor circuit 111 may be equivalent to an up equivalent resistor $R_U$ with large resistance (e.g., millions to trillions ohms). Similarly, the down transistor circuit 112 may be equivalent to a down equivalent resistor RD with large resistance. The up equivalent resistor $R_U$ and the down equivalent resistor RD constitute a low-pass filter (LPF), which filters out noise of the original power VDD, therefore generating the stable voltage $V_{LPF}$ with reduced noise or even without noise.

In general, the original power VDD may possess noise spanning from high frequency to low frequency. Accordingly, it is preferred in the embodiment to select a substantially low cut-off frequency $f_C$. According to the relationship of $f_C=1/(2\pi\ RC)$, the resistance R of the up equivalent resistor $R_U$ and the capacitance C of the capacitor $C_{LPF}$ should be large. As a capacitor in an integrated circuit occupies a substantial area, the capacitance of the capacitor should not be large. As mentioned above, the up equivalent resistor $R_U$ of the embodiment has large resistance; a low cut-off frequency $f_C$ can thus be obtained with low capacitance of the capacitor $C_{LPF}$.

As discussed above, the up equivalent resistor $R_U$ of the embodiment is made up of transistor(s), which occupy a small circuit area. By the contrary, a resistor, for example, a poly resistor, using 0.18 μm complementary metal-oxide-semiconductor (CMOS) process, occupies 100000 $\mu m^2$. For the same process, a transistor that is diode-connected or operates in a cut-off region or sub-threshold region with width of 0.3 μm and length of 10 μm may result in tens of millions ohms.

Referring to FIG. 1, the frequency generating circuit 12 may include a first unity-gain buffer 121, also called voltage follower, which receives the stable voltage $V_{LPF}$ generated from the power generating circuit 11, and feeds the stable voltage $V_{LPF}$ as a power to a digital-to-analog converter (DAC) 122. In the embodiment, the first unity-gain buffer 121 may include an operational amplifier (OP) having an output end connected to an inverting input end, and a non-inverting input end receiving the stable voltage $V_{LPF}$. The operational amplifier may use the original power VDD as a power. In another embodiment, the stable voltage $V_{LPF}$ generated from the power generating circuit 11 is directly provided as a power to the DAC 122 without using the first unity-gain buffer 121.

The frequency generating circuit 12 may further include a current source/sink circuit 123, which receives an analog signal A outputted from the DAC 122, and outputs a control voltage $V_C$ to control a voltage-controlled oscillator (VCO) 124. In the embodiment, the current source/sink circuit 123 may include a second unity-gain buffer, which may compose a structure the same as the first unity-gain buffer 121, details of which are thus omitted for brevity.

Figure 4:
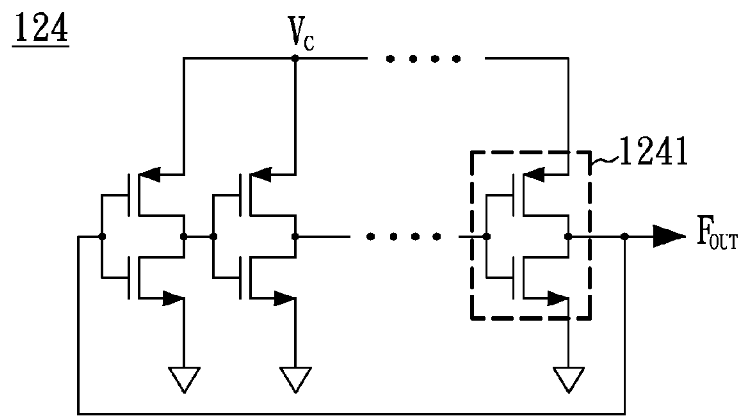
FIG. 4 shows a circuit diagram illustrating the voltage-controlled oscillator of FIG. 1.

The VCO 124 receives the control voltage $V_C$ outputted from the current source/sink circuit 123, and accordingly generates the frequency signal $F_{OUT}$. FIG. 4 shows a circuit diagram illustrating the VCO 124 of FIG. 1. The VCO 124 of the embodiment may include a plurality of (e.g., odd number of) inverters 1241, which are connected in parallel to form a ring oscillator. Each inverter 1241 includes series-connected P-type transistor and N-type transistor, which are electrically coupled between the control voltage $V_C$ and ground. The frequency of the frequency signal $F_{OUT}$ may be increased by raising the control voltage $V_C$, and may be decreased by lowering the control voltage $V_C$.

The frequency generating circuit 12 may further include a digital controller 125, which receives the frequency signal $F_{OUT}$ (e.g., with high frequency) and a reference signal $F_{IN}$ (e.g., with low frequency), according to which a digital signal D is generated and fed to an input end of the DAC 122, thereby controlling the DAC 122 to increase or decrease the analog signal A (or the control voltage $V_C$). Accordingly, the frequency of the frequency signal $F_{OUT}$ may thus be controlled. In one embodiment, the reference signal $F_{IN}$ may be provided by a crystal oscillator (not shown) or other reference-frequency generators. The digital controller 125 may be powered by the original power VDD.

Figure 5A:
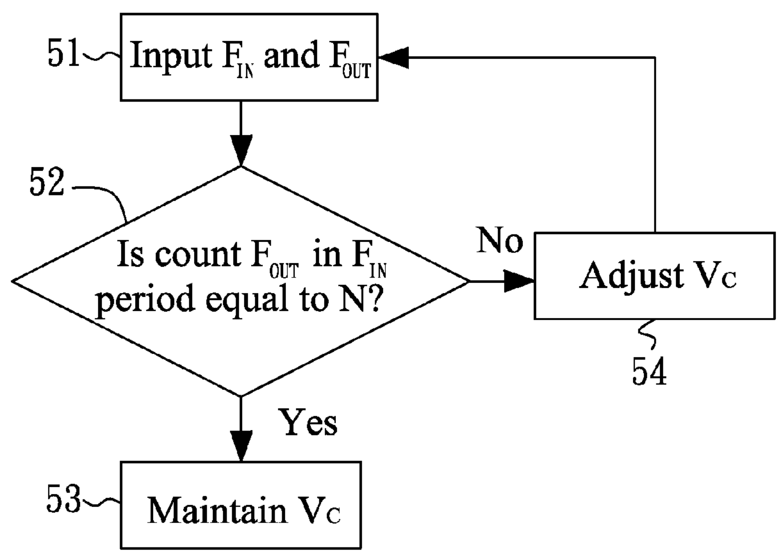
FIG. 5A shows a flow diagram of the digital controller of FIG. 1.
Figure 5B:
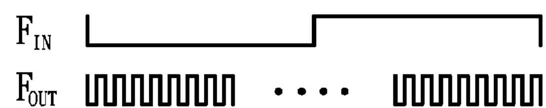
FIG. 5B shows a timing diagram exemplifying a reference signal and a frequency signal.

FIG. 5A shows a flow diagram of the digital controller 125 of FIG. 1. First, in step 51, the reference signal $F_{IN}$ and the frequency signal $F_{OUT}$ are inputted. FIG. 5B shows a timing diagram exemplifying a low-frequency reference signal $F_{IN}$ and a high-frequency frequency signal $F_{OUT}$. Subsequently, in step 52, during a period of the reference signal $F_{IN}$, the frequency signal $F_{OUT}$ are counted to result in an amount, which is then compared with a predetermined number N. If the amount is equal to N, proceed to step 53, in which the digital signal D (or the control voltage $V_C$) is maintained. If the amount is not equal to N, proceed to step 54, in which the digital signal D is changed to adjust the control voltage $V_C$. For example, if the amount is less than the predetermined N, the digital signal D is increased; if the amount is greater than the predetermined N, the digital signal D is decreased.

According to the embodiment discussed above, the power generating circuit 11 may generate an anti-power-noise stable voltage $V_{LPF}$, such that the operation of the frequency generating circuit 12 (particularly the DAC 122) may not be liable to power noise. Moreover, as the up transistor circuit 111 and the down transistor circuit 112 with high resistance are made up of transistors, they occupy small circuit area. By contrary, a large capacitor is required to implement a filtering circuit in the conventional PLL. Further, the composing blocks of the frequency control system 100 of the embodiment consume low power. For an output frequency of 72 mega Hz using 0.18 μm process, for example, each composing block consumes a current of about 10 μA and an entire system consumes a current less than 100 μA. On the contrary, the conventional PLL or DLL using the same process will consume a current of about 1 mA.

Although specific embodiments have been illustrated and described, it will be appreciated by those skilled in the art that various modifications may be made without departing from the scope of the present invention, which is intended to be limited solely by the appended claims.

What is claimed is:

1. A frequency control system, comprising:
- a power generating circuit including an up transistor circuit, a down transistor circuit and a capacitor, the up transistor circuit and the down transistor circuit being connected in series and having a node situated therebetween, the capacitor being electrically coupled between the node and ground, a stable voltage being generated at the node; and
- a frequency generating circuit including:
  - a digital-to-analog converter (DAC) receiving the stable voltage as a power, the DAC outputting an analog signal;
  - a current source/sink circuit receiving the analog signal and outputting a control voltage;
  - a voltage-controlled oscillator (VCO) receiving the control voltage and according generating a frequency signal; and
  - a digital controller receiving the frequency signal and a reference signal, according to which a digital signal is generated and fed to an input end of the DAC.

2. The frequency control system of claim 1, wherein the up transistor circuit comprises at least one transistor, and the down transistor circuit comprises at least one transistor.

3. The frequency control system of claim 2, wherein said at least one transistor of the up transistor circuit or the down transistor circuit is diode-connected or operates at a cut-off region.

4. The frequency control system of claim 1, further comprising a first unity-gain buffer disposed between the stable voltage and the DAC, the first unity-gain buffer receiving the stable voltage, which is outputted to the DAC as the power.

5. The frequency control system of claim 4, wherein the first unity-gain buffer comprises an operational amplifier having an output end connected to an inverting input end, and having a non-inverting input end to receive the stable voltage.

6. The frequency control system of claim 1, wherein the current source/sink circuit comprises a second unity-gain buffer.

7. The frequency control system of claim 6, wherein the second unity-gain buffer comprises an operational amplifier having an output end connected to an inverting input end, and having a non-inverting input end to receive the analog signal.

8. The frequency control system of claim 1, wherein the VCO comprises a ring oscillator.

9. The frequency control system of claim 8, wherein the VCO comprises a plurality of inverters, which are connected in parallel, each inverter being electrically coupled between the control voltage and ground.

10. The frequency control system of claim 9, wherein the VCO comprises odd number of inverters.

11. The frequency control system of claim 1, wherein the digital controller performs the following steps:

inputting the reference signal and the frequency signal;

counting the frequency signal during a period of the reference signal to result in an amount, which is compared with a predetermined number;

maintaining the digital signal if the amount is equal to the predetermined number; and adjusting the digital signal if the amount is not equal to the predetermined number.

12. The frequency control system of claim 11, wherein the digital signal is increased if the amount is less than the predetermined number; and the digital signal is decreased if the amount is greater than the predetermined number.

13. A power generating circuit, comprising:

an up transistor circuit;

a down transistor circuit, the up transistor circuit and the down transistor circuit being connected in series and having a node situated therebetween; and a capacitor being electrically coupled between the node and ground, a stable voltage being generated at the node.

14. The power generating circuit of claim 13, wherein the stable voltage is fed to a digital-to-analog converter (DAC) as a power.

15. The power generating circuit of claim 13, wherein the up transistor circuit comprises at least one transistor, and the down transistor circuit comprises at least one transistor.

16. The power generating circuit of claim 15, wherein said at least one transistor of the up transistor circuit or the down transistor circuit is diode-connected or operates at a cut-off region.

17. A frequency generating circuit, comprising:

a digital-to-analog converter (DAC) receiving a stable voltage as a power, the DAC outputting an analog signal;

a current source/sink circuit receiving the analog signal and outputting a control voltage;

a voltage-controlled oscillator (VCO) receiving the control voltage and according generating a frequency signal; and a digital controller receiving the frequency signal and a reference signal, according to which a digital signal is generated and fed to an input end of the DAC.

18. The frequency generating circuit of claim 17, further comprising a first unity-gain buffer disposed between the stable voltage and the DAC, the first unity-gain buffer receiving the stable voltage, which is outputted to the DAC as the power.

19. The frequency generating circuit of claim 18, wherein the first unity-gain buffer comprises an operational amplifier having an output end connected to an inverting input end, and having a non-inverting input end to receive the stable voltage.

20. The frequency generating circuit of claim 17, wherein the current source/sink circuit comprises a second unity-gain buffer.

21. The frequency generating circuit of claim 20, wherein the second unity-gain buffer comprises an operational amplifier having an output end connected to an inverting input end, and having a non-inverting input end to receive the analog signal.

22. The frequency generating circuit of claim 17, wherein the VCO comprises a ring oscillator.

23. The frequency generating circuit of claim 22, wherein the VCO comprises a plurality of inverters, which are connected in parallel, each inverter being electrically coupled between the control voltage and ground.

24. The frequency generating circuit of claim 23, wherein the VCO comprises odd number of inverters.

25. The frequency generating circuit of claim 17, wherein the digital controller performs the following steps:

inputting the reference signal and the frequency signal;

counting the frequency signal during a period of the reference signal to result in an amount, which is compared with a predetermined number;

maintaining the digital signal if the amount is equal to the predetermined number; and adjusting the digital signal if the amount is not equal to the predetermined number.

26. The frequency generating circuit of claim 25, wherein the digital signal is increased if the amount is less than the predetermined number; and the digital signal is decreased if the amount is greater than the predetermined number.

* * * * *